(12) United States Patent
Claprood et al.

(10) Patent No.: US 6,220,678 B1
(45) Date of Patent: Apr. 24, 2001

(54) ELECTRICAL CABINET

(75) Inventors: Edward Claprood, Southborough, MA (US); Lawrence G. Pignolet, Mapleville, RI (US)

(73) Assignee: EMC Corporation, Hopkinton, MA (US)

( * ) Notice: Subject to any disclaimer, the term of this patent is extended or adjusted under 35 U.S.C. 154(b) by 0 days.

(21) Appl. No.: 09/342,277

(22) Filed: Jun. 29, 1999

(51) Int. Cl.⁷ .................................................. A47B 81/00
(52) U.S. Cl. .................................. 312/223.2; 312/223.1; 361/259; 292/87
(58) Field of Search ................ 312/223.2, 223.1, 312/327, 328, 309, 310; 292/87, 89, 128; 361/683, 752, 759, 801

(56) References Cited

U.S. PATENT DOCUMENTS

| | | | |
|---|---|---|---|
| 4,662,664 | * 5/1987 | Wendt et al. | 292/87 X |
| 4,750,091 | * 6/1988 | Van Hout | 361/759 X |
| 4,764,414 | * 8/1988 | Beun | 361/752 X |
| 5,227,958 | * 7/1993 | Glomski et al. | 361/752 |
| 5,229,923 | * 7/1993 | Long et al. | 361/759 X |
| 5,398,156 | * 3/1995 | Steffes et al. | 361/683 |
| 5,398,162 | * 3/1995 | Bice | 361/759 X |
| 5,594,627 | * 1/1997 | Le | 361/752 X |
| 5,668,699 | * 9/1997 | Bell et al. | 361/752 X |
| 5,877,938 | * 3/1999 | Hobbs et al. | 312/223.2 X |
| 6,005,775 | * 12/1999 | Chiu | 361/752 |

FOREIGN PATENT DOCUMENTS

362295119 * 12/1987 (JP) .................................. 312/223.2

* cited by examiner

*Primary Examiner*—Peter M. Cuomo
*Assistant Examiner*—Hanh V. Tran
(74) *Attorney, Agent, or Firm*—Daly, Crowley & Mofford, LLP

(57) ABSTRACT

An electrical cabinet having a latchable door for providing regular access to electrical components stored therein and a mounting apparatus for holding electrical components therein. The latchable door having a latching member for holding the door in an open position. The mounting apparatus molded to the electrical cabinet and capable of securing electrical components within the cabinet.

10 Claims, 13 Drawing Sheets

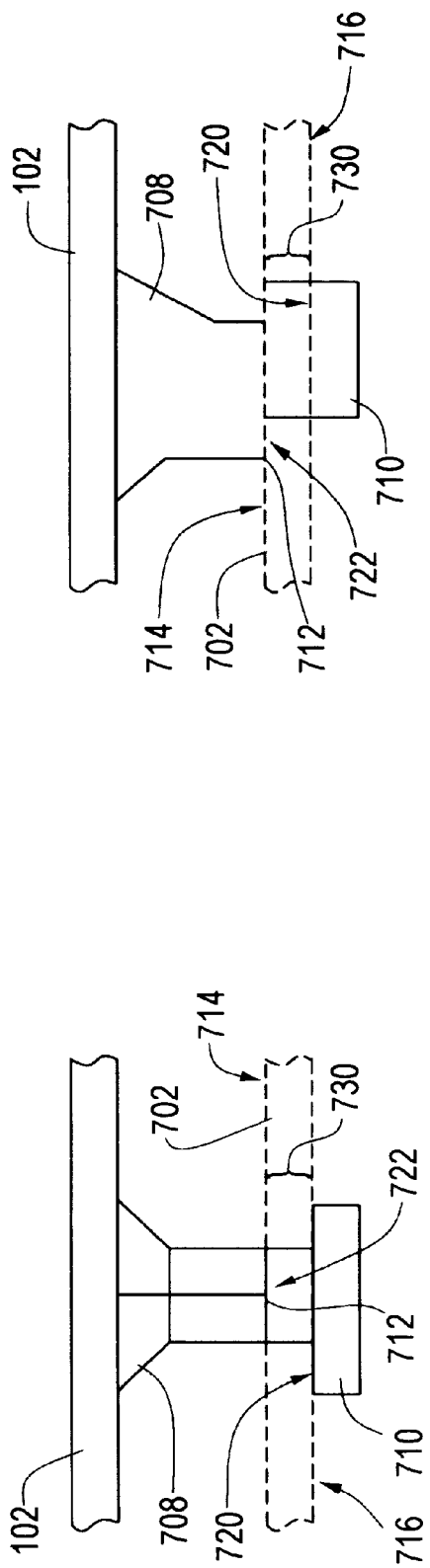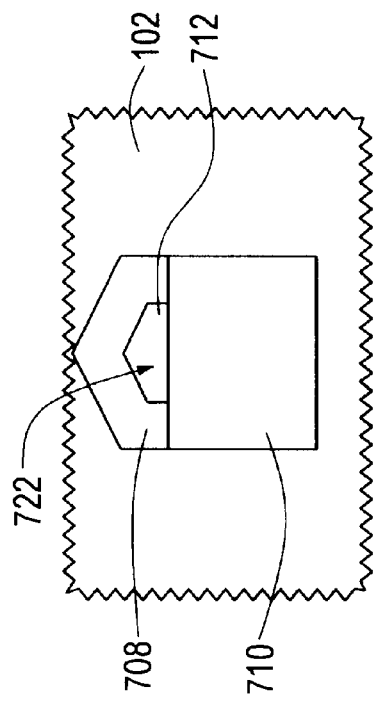
*FIG. 10A*  *FIG. 10B*  *FIG. 10C*

ELECTRICAL CABINET

BACKGROUND OF THE INVENTION

The invention relates generally to an electrical cabinet adapted to store, or house, electrical components, and, more particularly to an electrical cabinet adapted to store printed circuit boards used in data storage and/or transfer systems.

As is known in the art, an electrical cabinet is used to store, or house, a variety of electrical components such as printed circuit boards. An electrical cabinet permits components housed within the cabinet to be interconnected and also allows components within the cabinet to be connected to components outside the cabinet. The components housed within the cabinet often maintain or control data storage or data transfer systems.

Typically, administrators of a data storage or transfer systems contained within an electrical cabinet desire regular access to particular components housed within the cabinet. The administrators desire such access to increase their ability to monitor a system's functions and/or to exert control over the housed system.

When an electrical cabinet is assembled, components may be installed to provide administrators with access to monitor a system's functions and/or to exert control over the systems housed in such cabinet. However, current installation techniques are labor intensive, often including the attachment or machining of several parts, and therefore cost ineffective.

Also, the access provided to components within electrical cabinets is inconvenient for the type of regular access administrators of systems desire. Current mechanism fail to provide quick and easy regular access to particular stored components within electrical cabinets.

SUMMARY OF THE INVENTION

In accordance with one aspect of the present invention, an electrical cabinet is provided for storing or housing electrical components having a door which latches in an open position. The door has an engaging member and a hinge. The engaging member contacts a latching member of the electrical cabinet as the door is opened. The engaging member deflects the latching member from a first position in the path of the door to a flexed position removed from that path. As the door is opened the engaging member passes beyond the latching member and once the door is completely opened the latching member returns resiliently to the first position fitting within a divot in the door. The latching member, positioned within this divot, holds the door up in an open position.

The engaging member also serves to contact the latching member and remove it from the divot as the door is closed. The engaging member again engages the latching member and, provided that sufficient force is applied, displaces the latching member out of the divot and into the flexed position, removing the latching member from the path of the door. As the latching member is displaced into the flexed position the door is allowed to close. Once closed, the latching member returns resiliently to its original position.

In accordance with another aspect of the present invention an electrical cabinet is provided having a printed circuit board mount. The mount is designed to hold the circuit board next to a portion of the cabinet so to provide access to displays and/or switches stored on the board.

The mount has a mount post, a head and a receiving slot, which together are used to mount a printed circuit board within the electrical cabinet. The mount post serves to connect and elevate the head from a surface portion of the electrical cabinet. The mount post further has a notch, which together with the head forms the receiving slot. The mount post is designed to fit snugly into a slot in the circuit board.

In an embodiment of the invention a latch is provided to secure the printed circuit board within the mount. The latch has a latch post and a latching member. The latch engages the printed circuit board between a surface of the latch post and a surface of the latching member holding the circuit board within the receiving slot in the mount. The latch also may have a protraction designed to fit within a latching slot in the circuit board. The protraction stabilizes the circuit board, preventing movement or torquing of the board which could break the latch. The invention is further designed to be made in a one piece molding process.

BRIEF DESCRIPTION OF THE DRAWING

These and other features of the invention will become more readily apparent from the following detailed description when read together with the accompany drawings, in which:

FIG. 10A is a top view of the invention holding a printed circuit board;

FIG. 10B is a cross-sectional side view of FIG. 10A;

FIG. 10C is a front view of FIG. 10A with the printed circuit board removed;

DESCRIPTION OF THE PREFERRED EMBODIMENTS

Figure 1:
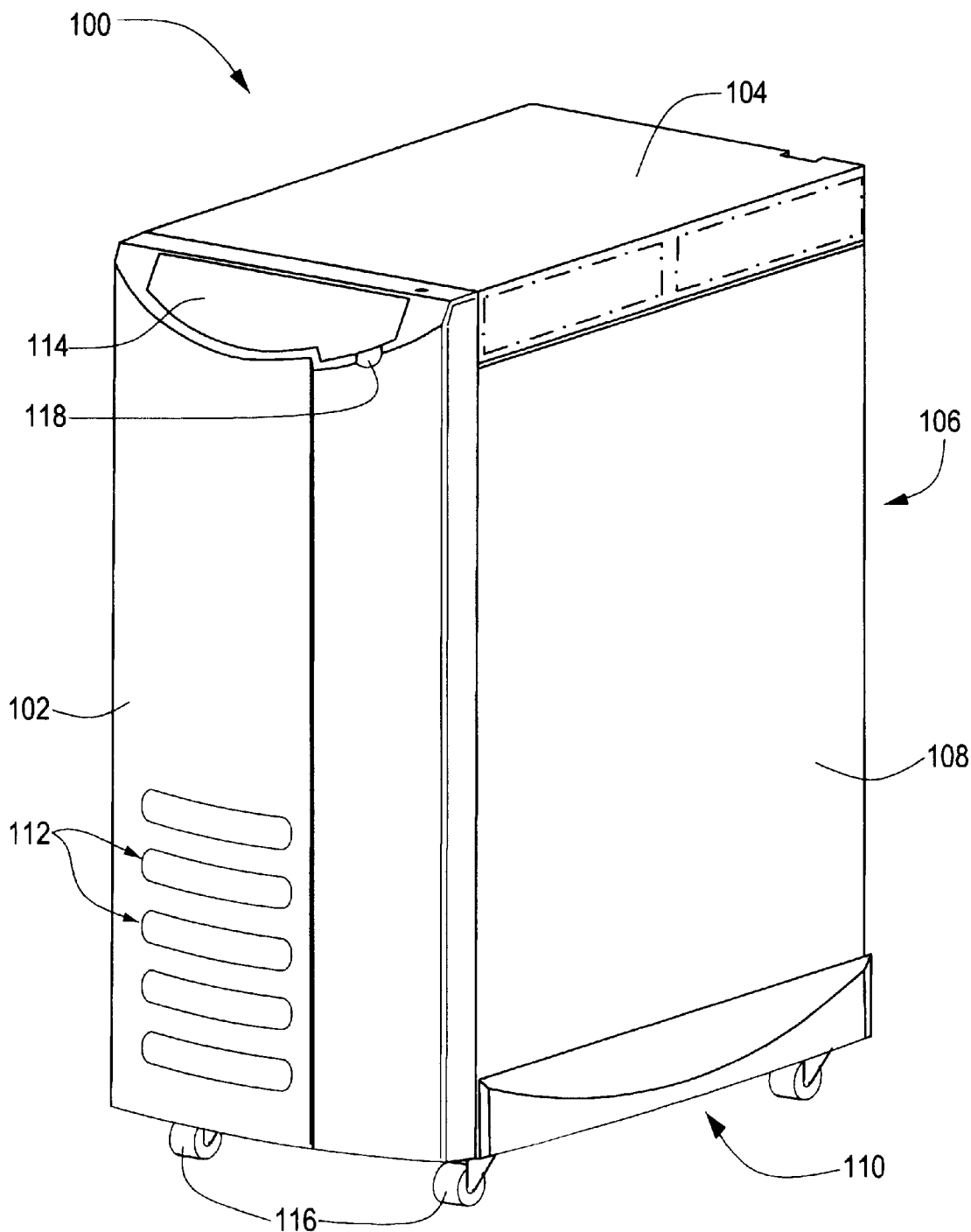
FIG. 1 is a perspective view of an electrical cabinet.

Referring to FIG. 1, an electrical cabinet 100 is adapted for the storage and operation of electrical components. For example, electrical components stored within the cabinet 100 may include CPUs, printed circuit boards, backplanes, batteries, cables, connectors and wires. Typically, electrical components housed within the interior of the cabinet 100 are combined to provide electrical systems, particularly, such systems often include data storage and data transfer technologies. Cabinet 100 is typically made of molded plastic. Here, each of the parts of the cabinet are designed to be made in a single-step molding process.

Electrical cabinet 100 has a front 102, a top 104, a back 106, two sides 108 and a bottom 110. Bottom 110 of cabinet 100 has wheels 116 for increasing cabinet 100's mobility. Front 102 has vents 112 for allowing air to circulate within, and be exhausted from, the cabinet 100. The circulation of air within cabinet 100 serves to cool the components stored within the cabinet's interior.

Front 102 of cabinet 100 also has a door 114 for providing regular access to the interior of cabinet 100. Door 114 functions, in particular, to provide an administrator, or any other person operating the electrical system stored by cabinet 100, with the ability to access and monitor and/or control particular functions performed by, or controlled by, components within a cabinet 100.

Figure 2:
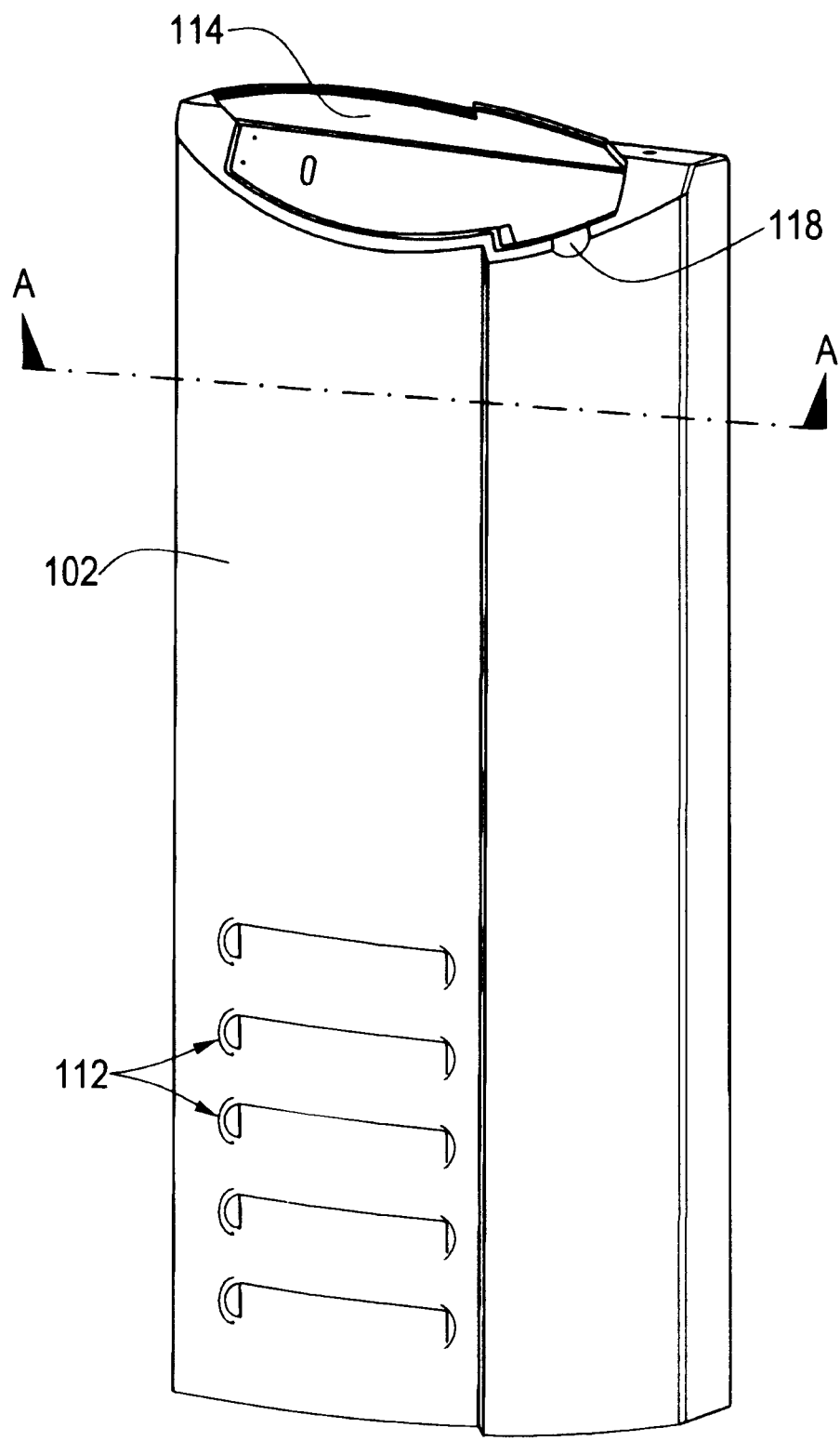
FIG. 2 is a perspective view of the front of FIG. 1 with the invention in an open position.
Figure 3:
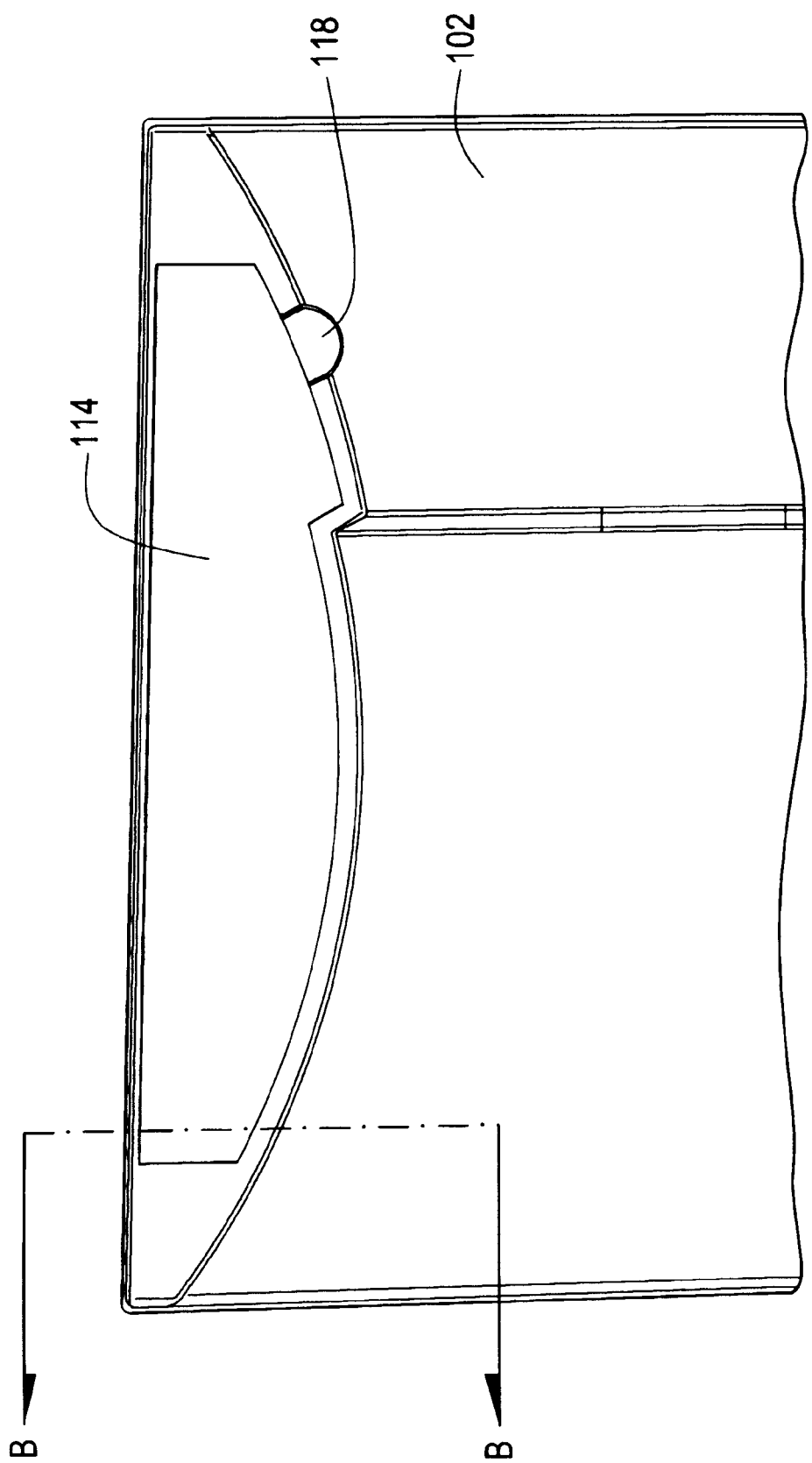
FIG. 3 is a close up of the FIG. 2 along the line A—A with the invention in a closed position.

The door 114 may be opened (FIG. 2) and closed (FIGS. 1, 3) repeatedly, providing easy, regular access to the cabinet's interior. The door 114 is designed to latch, or become fixed, while it is in an open position facilitating the work of an administrator. A finger slot 118 is also provided for assisting an individual attempting to open the door 114.

Figure 4:
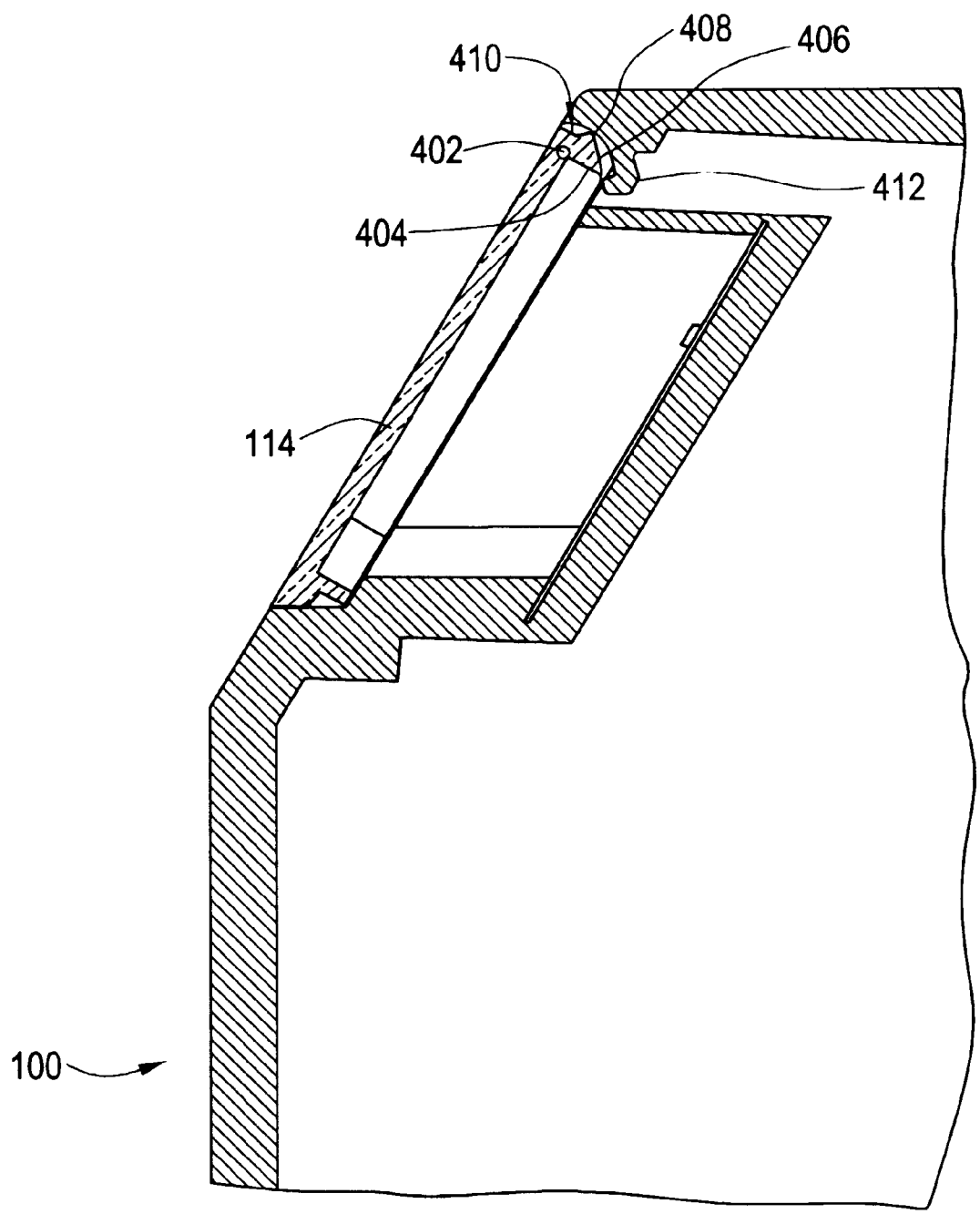
FIG. 4 is a side view along the lines B—B of FIG. 3.
Figure 5:
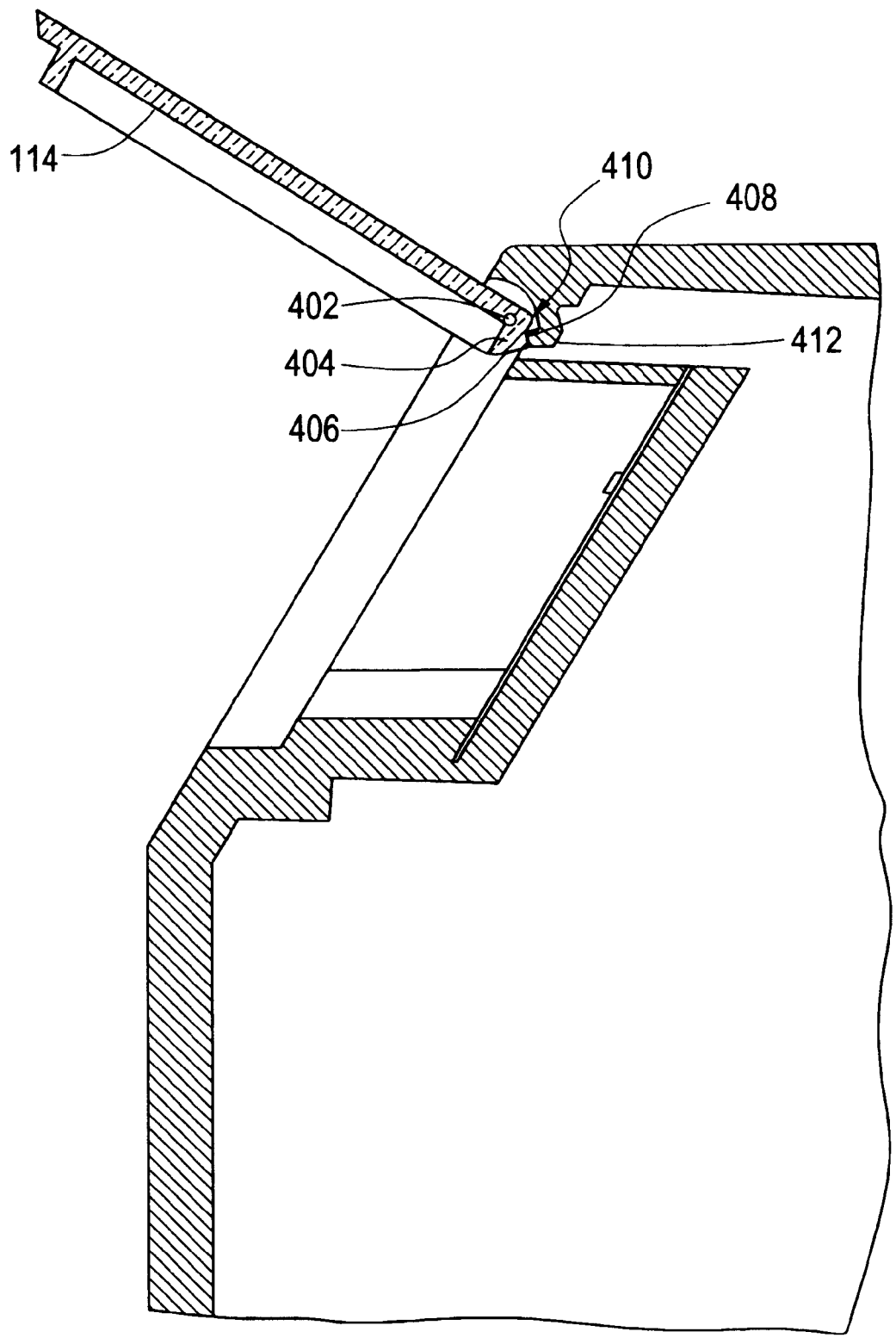
FIG. 5 is a side view of FIG. 4 with the invention in an open position.
Figure 6:
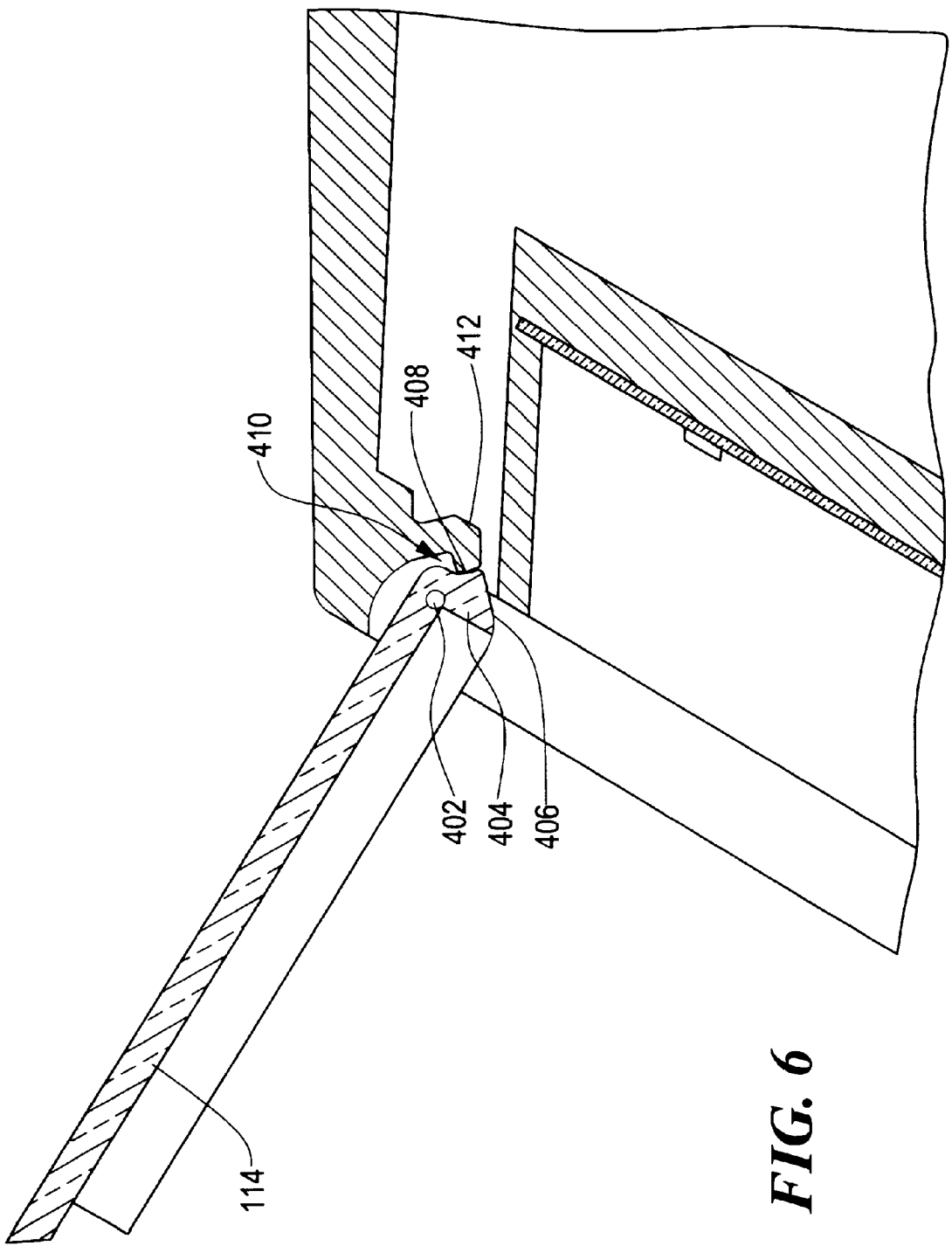
FIG. 6 is a close up of FIG. 5.

Referring now to FIGS. 4-6, door 114 has a hinge 402 pivotly connecting door 114 to cabinet 100. Hinge 402 allows door 114 to rotate about an axis between open and closed positions.

Door 114 further has an engaging member 404. Engaging member 404 has a forward surface 406 and a rearward surface 408. The rearward surface 408 of engaging member 404 helps form a divot 410 in door 114.

In a closed position, (FIG. 4) the forward surface 406 of engaging member 404 contacts latching member 412. In an open position, (FIGS. 5, 6) latching member 412 fits into divot 410.

Latching member 412, here, is made from plastic in a single piece molding process with front 102. Such a flexible and resilient material allows latching member 412 to be displaced into a flexed, or second position, upon the application of a force and also to resiliently snap back to its original, or first position, upon the removal of the force.

To open the door 114, a sufficient force, particularly the force applied by a person's finger placed in slot 118 gently pushing up, is applied to door 114. Such an upward force causes the forward surface 406 of engagement member 404 to engage latching member 412. This engagement of latching member 412 by forward surface 406 bends member 412 back into a flexed, or second, position removed from the path of door 114. As door 114 is further opened latching member 412 is further displaced until door 114 is completely opened.

When door 114 is completely open latching member 412 is past the forward surface 406 of engagement member 404 allowing latching member 412 to return resiliently to its original, or first, position. Such movement by latching member 412 causes it to be positioned within divot 410, effectively latching door 114 in its open position (FIGS. 5, 6).

To close door 114, a sufficient force, particularly the force applied by a person's hand gently pushing down on door 114, is applied to the door 114. Such a force causes the rearward surface 408 of engagement member 404 to engage latching member 412. Here, rearward surface 408 deflects latching member 412 back out of the path of door 114 unlatching the door from its open position allowing the door to close. When the latching member is past the rearward surface 408 of engagement member 404 the latching member 412 returns to its original, or first, position and the door 114 is closed (FIG. 4).

Figure 7:
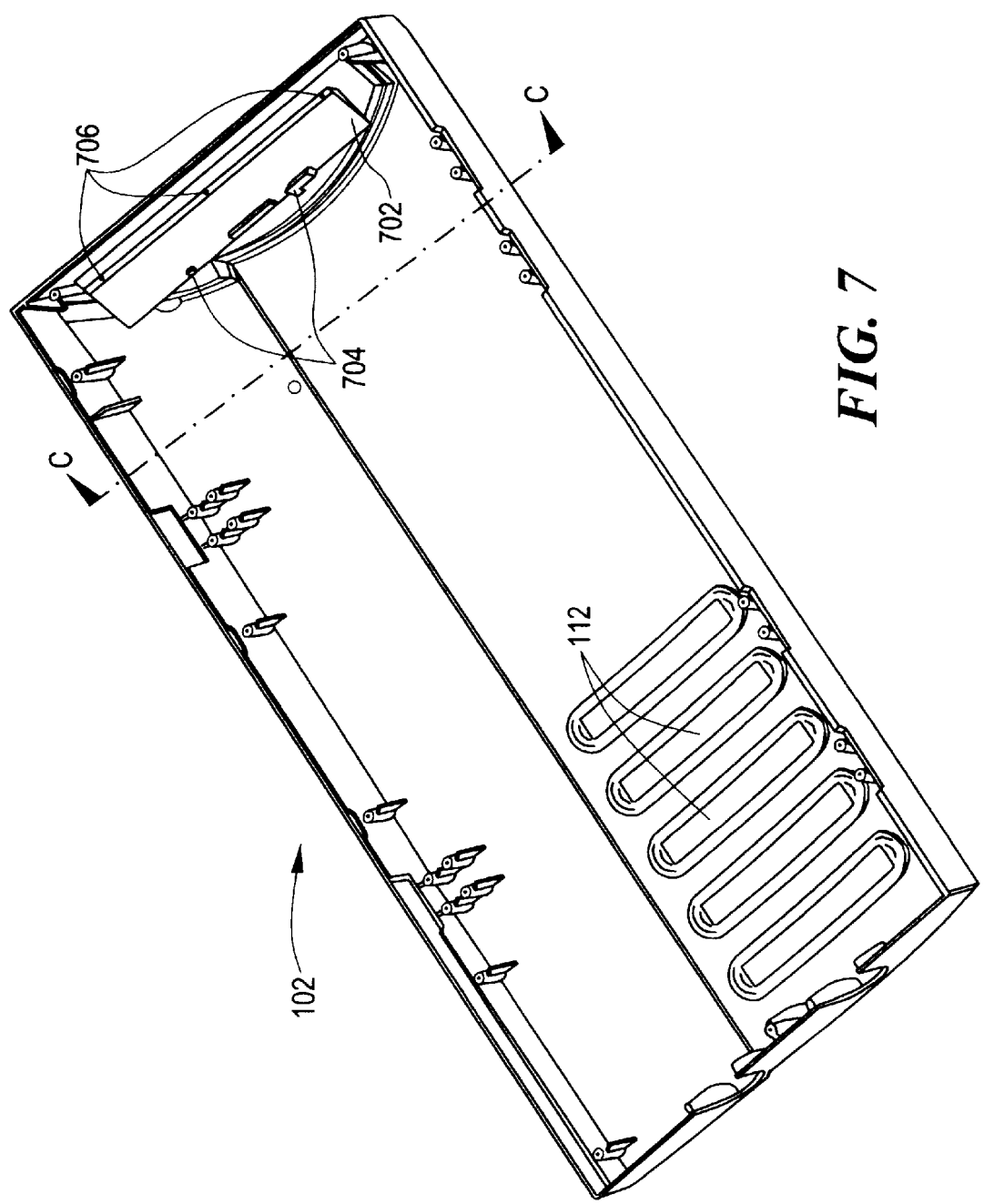
FIG. 7 is a internal view of FIG. 1.
Figure 8:
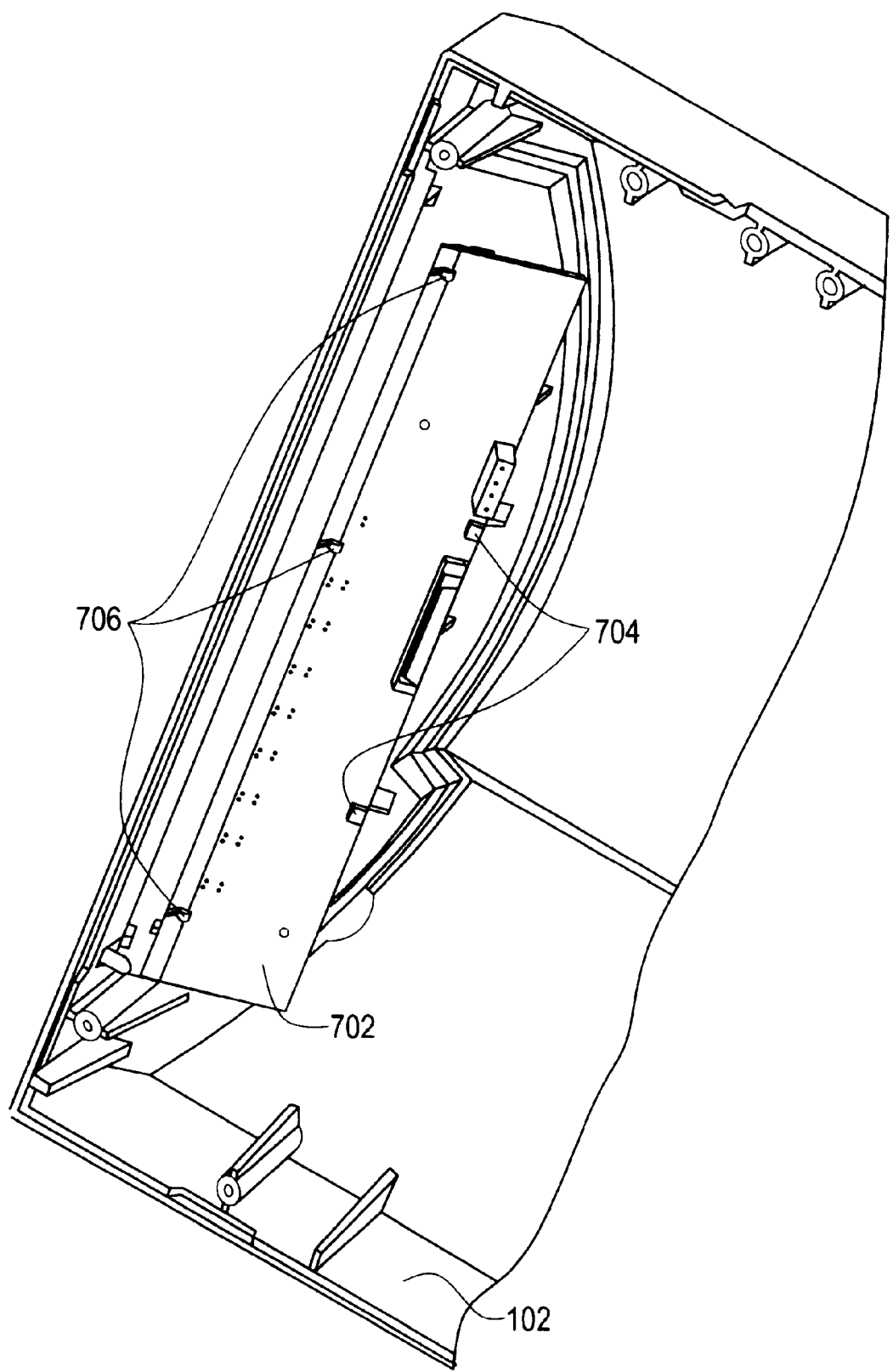
FIG. 8 is a close up of FIG. 7 along the line C—C.

Referring now to FIG. 7–8, the interior of the cabinet 100 has a printed circuit board 702. In particular, printed circuit board 702 is mounted on two mounts 704 on the front 102 of cabinet 100 and held in position by three latches 706 also on the front 102 of cabinet 100. Furthermore, mounts 704 and latches 706 are made of plastic in a one piece molding process as part of front 102.

Here in FIG. 7, board 702 is positioned directly behind door 114 allowing board 702 to be viewed when the door 114 is in its open position. Furthermore, mounts 704 and latches 706 hold board 702 at an angle relative to the floor upon which cabinet 100 is positioned providing an easier angle for an administrator to view the board 702. For example, if the floor upon which cabinet 100 is positioned is horizontal and the front 102 of cabinet 100 is vertical the board 702 is held at an angle of approximately 30 degrees from vertical. Such a 30 degree angle relative to vertical provides an improved view for administrators to observe the functions and/or controls displayed on board 702.

Figure 9:
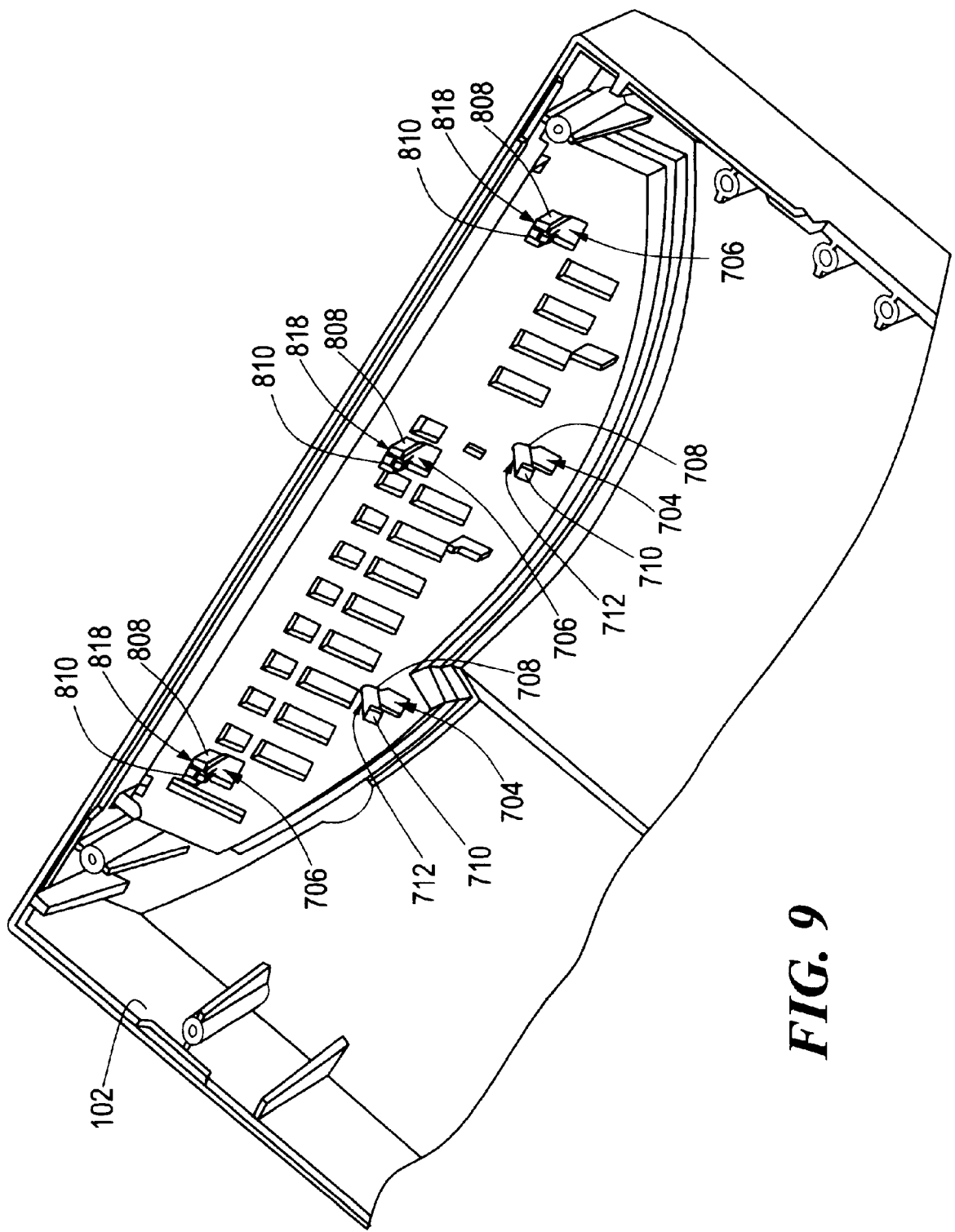
FIG. 9 is FIG. 8 with the printed circuit board removed.
Figure 11:
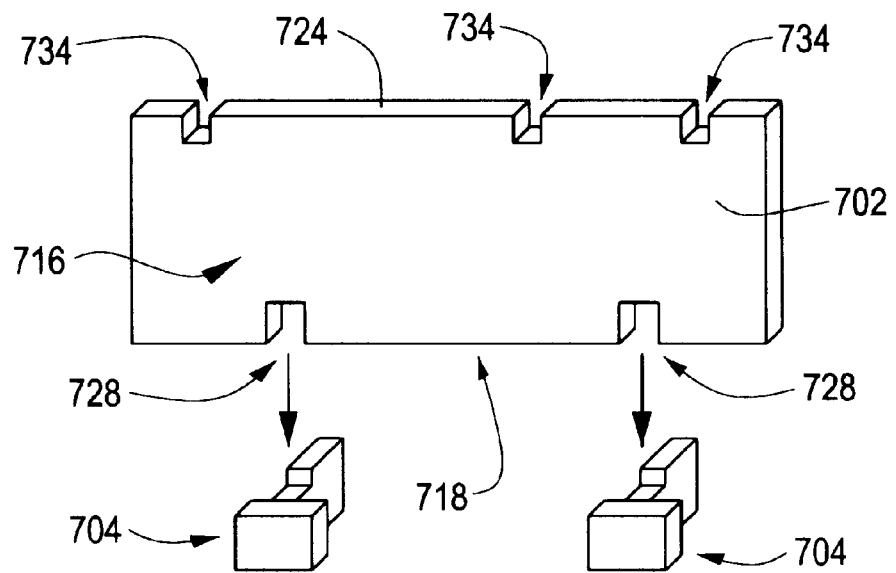
FIG. 11 is an exploded perspective view of a printed circuit board and the invention.

Mount 704, as better seen in FIGS. 9-11, is a molded as part of front 102 of cabinet 100. Here, mount 704 has a mount post 708 which is attached to the cabinet front 102 at its far, or rather forward end. Mount 704 also has a head 710 which is attached to mount post 708 at its near, or rather rearward end of post 708. Here, head 710 is molded as part of front 102 and has a head surface 720. Head 710 is connected to, and elevated from, a surface portion of front 102 of cabinet 100 by mount post 708.

Mount 704 further has a notch 712 in post 708. Notch 712 is part of post 708 and has a notch surface 722. Together the head surface 720 and the notch surface 722 form a receiving slot 730 (FIG. 10A & 10B) in mount 704. Receiving slot 730 in a mount 704 is adapted to receive printed circuit board 702.

Figure 12:
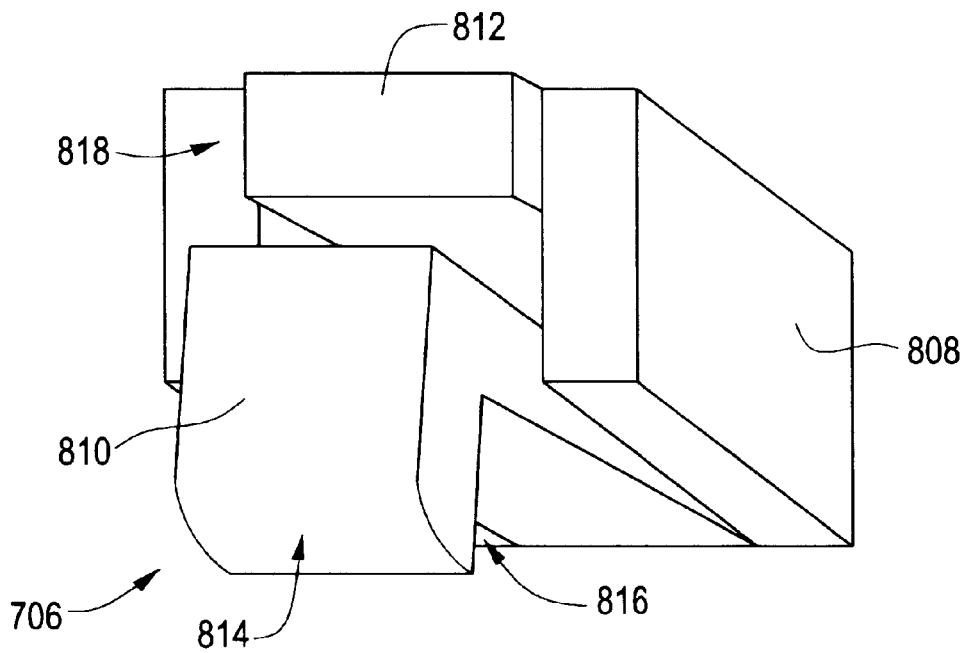
FIG. 12 is a perspective view of the invention.

Latch 706, better seen in FIGS. 9 and 12, here is molded as part of cabinet 102. Latch 706 has a latch post 808 and a latching member 810. Latch post 808 has a post surface 818 in its near, or rather the rearward, portion and a protraction 812. Latching member 810, also molded as part of front 102, is surrounded by latch post 808. Latching member 810 has a forward surface 814 and a latching surface 816.

Printed circuit board 702 (FIG. 8 and 11), has an internal surface 716 and a forward surface 714 opposite to the internal surface 716. Board 702 also has a mounting edge 718 with mounting slots 728, and a latching edge 724 with latching slots 734.

Figure 13:
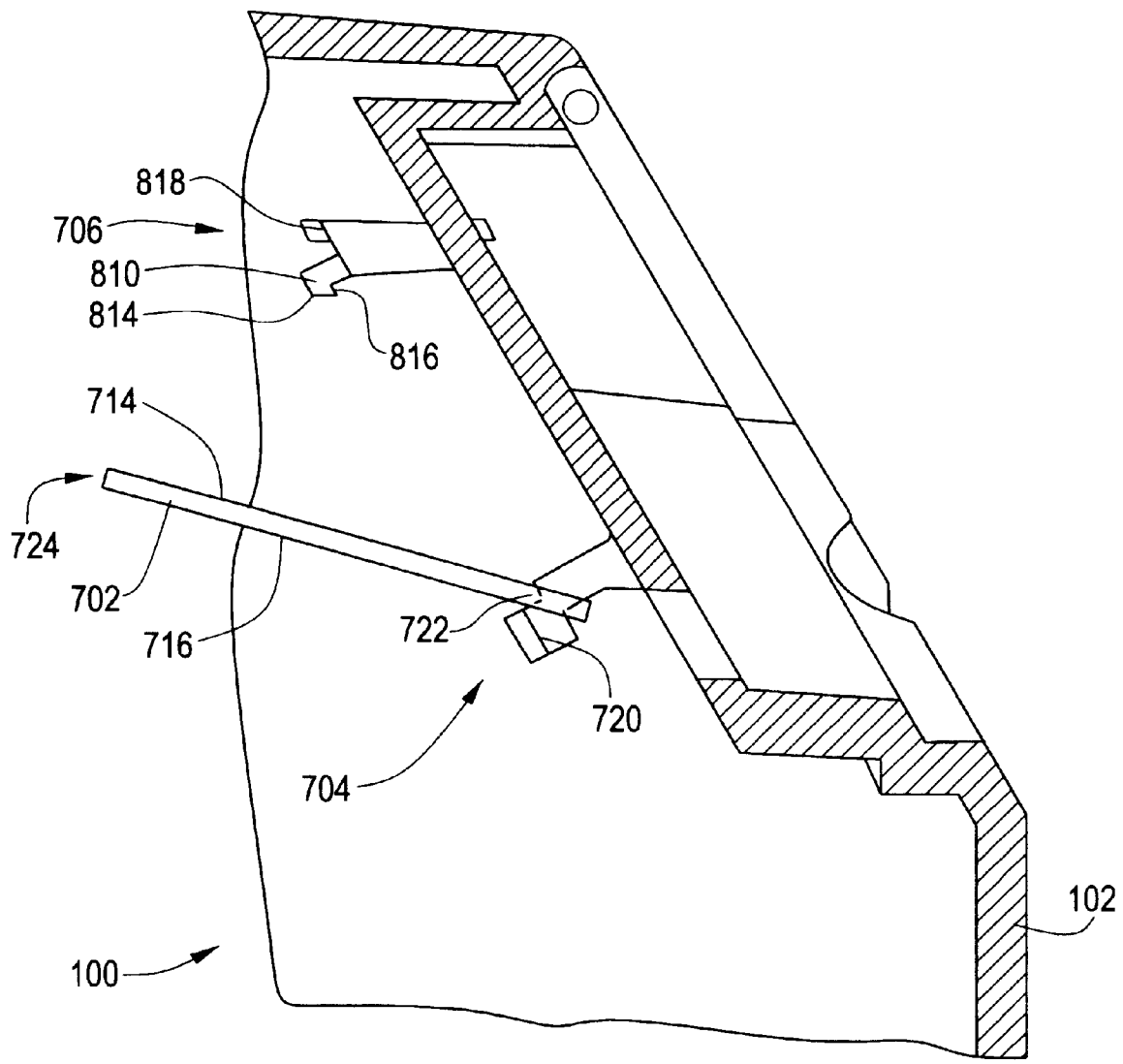
FIG. 13 is a side view of the invention with a printed circuit board in the process of being mounted.
Figure 14:
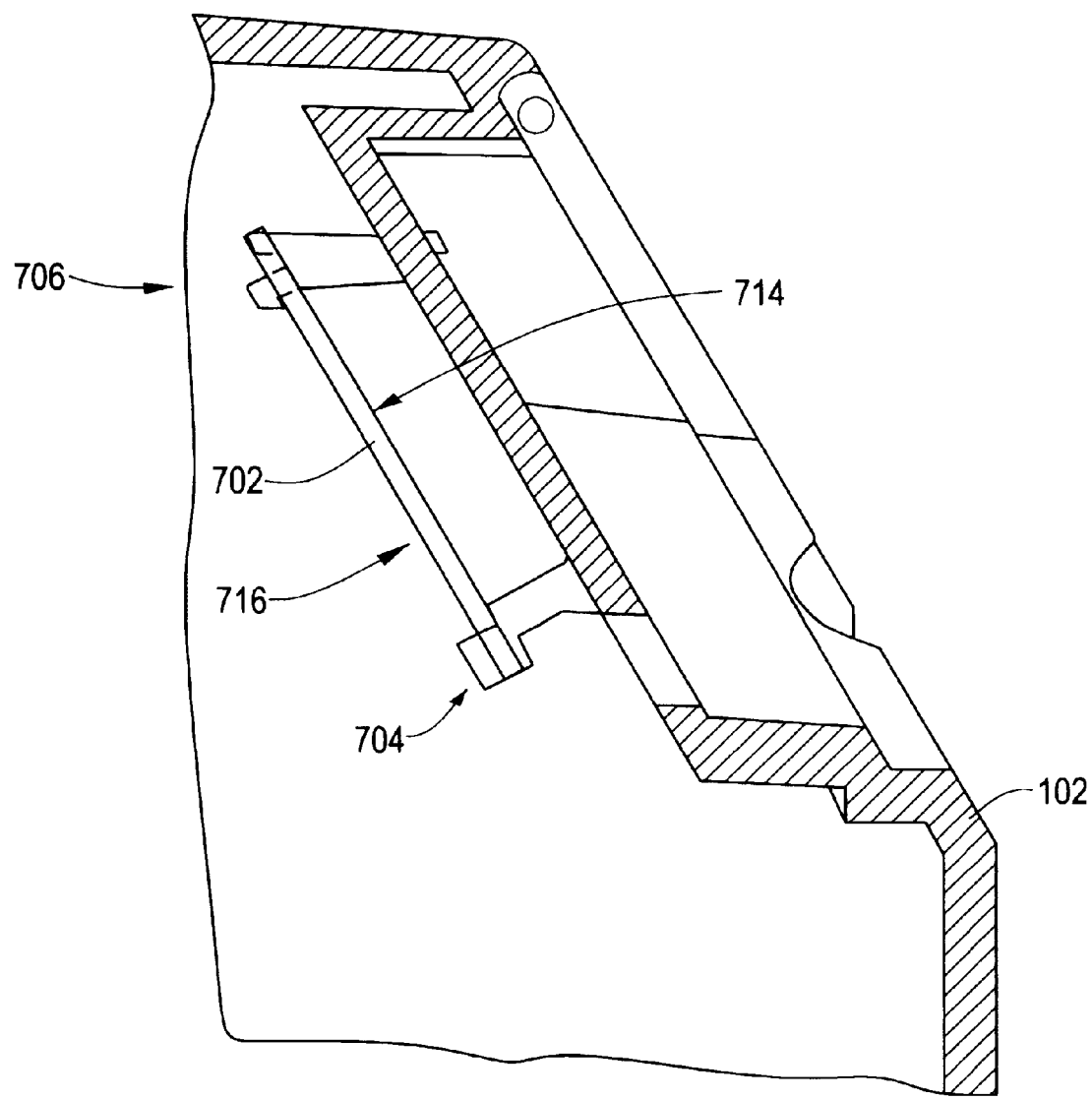
FIG. 14 is a side view of FIG. 13 with the printed circuit board mounted.

Board 702 is mounted onto a mounts 704 (FIGS. 13, 14), and latched by latches 706 by inserting mounting slots 728 of mounting edge 718 into mount posts 708. Latching edge 724 is rotated toward latches 706 until a portion of the forward surface 714 of board 702 is adjacent the notch surface 722 and a portion of the internal surface 716 is adjacent head surface 720 within receiving slot 730. In particular, receiving slots 730 are so space such that notch surfaces 722 and head surfaces 720 engage board 702 at receiving slots 730 as latches 706 engage and latch board 702 in latching slots 734.

Latches 706 engage and latch board 702 when the forward surface 814 of latching member 810 contacts the latching edge 724 of board 702. The latching edge 724 of board 702 deflects latching member 810 from an original, or first, position in the path of board 702 to a flexed, or second, position displaced from such path.

Latching members 810 engage a portion of the latching edge 724, here latching slots 734, as latching edge 724 is pushed beyond the forward surface 814 of latching member 810. Once beyond edge 724, latching members 814 return resiliently to their first positions and latches 706 engage board 702 between latching surfaces 816, which engage portions of internal surface 716, and latch post surfaces 818, which engage portions of forward surface 714 of board 702. Furthermore, here, protrusions 812 fits within latching slots 734 holding board 702 in proper alignment with latching member 810. This placement of board 702 in mounts 704 and laches 706 holds the board 702 securely in the desired position.

One skilled in the art may now make numerous modifications and uses of, and departures from, the specific apparatus and techniques disclosed herein without departing from the invention disclosed. The invention has been described with reference to vertical and horizontal directions. However other orientations are possible. For example, neither door 114, latching member 412, mount 704, or latch 706 need be part of front 102 as described in the preferred embodiment. Rather, each may be made, individually or collectively, with any other part of cabinet 100. Further, all materials, dimensions, configuration, orientations, and combinations are provided as illustrative examples only and are not intended to be the only possible embodiments within the scope of the claims. Consequently, the invention is to be construed as embracing each and every novel feature and novel combination of features present in or possessed by the apparatus and techniques disclosed herein and limited only by the spirit and scope of the appended claims.

What is claimed is:

1. An electrical cabinet, comprising:
   (a) a printed circuit board mount, comprising:
   (b) a printed circuit board, the board having a forward surface, an internal surface, and a slot in a mounting edge thereof, the slot having a rear surface and a pair of side surfaces,
   (c) wherein the printed circuit board mount comprises:
      (A) a mount post having a notch, the notch having a notch surface in a portion thereof;
      (B) a head affixed to a portion of the mount post, wherein the mount post connects the head to, and elevates the head from, a surface portion of the cabinet, the head having a head surface in a portion thereof, and
      (C) a receiving slot being formed by the notch surface of the notch and the head surface of the head and adapted to receive the printed circuit board;
   (d) wherein, the board is insertable into the receiving slot in the mount, the mount post is insertable into the slot in the mounting edge of the board; and
   wherein a mounting portion of the forward surface of the board is disposed adjacent to the notch surface and a mounting portion of the internal surface of the board is disposed adjacent to the head surface and wherein the notch surface engages the rear surface of the slot in the board and wherein the head engages the side surfaces of the slot in the board.

2. The electrical cabinet in claim 1 further comprising:
   (a) a latch, comprising:
      (A) a latch post having a post surface in a portion thereof; and
      (B) a latching member integral with the cabinet for receiving the printed circuit board, the latching member having a forward surface and a latching surface, the latching member extending out beyond the latch post, the latch post surrounding part of the latching member; and
   wherein the circuit board further comprises: a latching edge configured to contact the forward surface of the latching member contacting the latching edge and deflecting the latching member from a first position in a path of the latching edge to a second position displaced from the path enabling the latching member to engage and become latched when the board is pushed beyond the forward surface of the latching member, the latch engaging the circuit board between the latching surface of the latching member and the post surface of the latch post.

3. The electrical cabinet in claim 2, further comprising, a latching slot at the latching edge of the circuit board.

4. The electrical cabinet in claim 2 wherein the latch is made of molded plastic.

5. The electrical cabinet in claim 2 wherein the latching surface of the latching member engages the internal surface of the circuit board.

6. The electrical cabinet in claim 2 wherein the post surface of the latch post engages the forward surface of the circuit board.

7. The electrical cabinet in claim 6 wherein the latch is made of molded plastic.

8. The electrical cabinet in claim 2 wherein the mount and the latch are made from a single piece of molded plastic.

9. The electrical cabinet in claim 1 wherein the circuit board is held at an angle relative to a floor upon which the cabinet is positioned.

10. The electrical cabinet in claim 1 wherein the mount is made of molded plastic.

* * * * *